United States Patent [19]

Esquivel et al.

[11] Patent Number: 5,306,935
[45] Date of Patent: Apr. 26, 1994

[54] METHOD OF FORMING A NONVOLATILE STACKED MEMORY

[75] Inventors: Agerico L. Esquivel, Dallas; Allan T. Mitchell, Garland, both of Tex.

[73] Assignee: Texas Instruments Incorporated, Dallas, Tex.

[21] Appl. No.: 900,225

[22] Filed: Jun. 17, 1992

Related U.S. Application Data

[60] Division of Ser. No. 741,978, Aug. 6, 1991, abandoned, which is a continuation of Ser. No. 287,973, Dec. 21, 1988, abandoned.

[51] Int. Cl.⁵ ............................................. H01L 29/788
[52] U.S. Cl. ............................ 257/315; 257/318; 437/43; 437/48
[58] Field of Search ................ 437/43, 48, 52; 257/301–316; 365/185; 148/DIG. 164

[56] References Cited

U.S. PATENT DOCUMENTS

| | | | |
|---|---|---|---|
| 4,686,758 | 8/1987 | Liu et al. | 437/34 |
| 4,692,994 | 9/1987 | Moniwa et al. | 148/DIG. 164 |
| 4,698,659 | 10/1987 | Mizutani | 357/42 |
| 4,713,142 | 12/1987 | Mitchelle et al. | 156/653 |

OTHER PUBLICATIONS

Inoue et al. "A Three Dimensional Static RAM", IEEE Device Letters, vol. ED 1-7, No. 3, May, 1986, pp. 327–329.

Muller et al. "Device Electronics For Integrated Circuits" by Muller et al. John Wiley and Sons., 1986, pp. 452–454.

*Primary Examiner*—Olik Chaudhuri
*Assistant Examiner*—H. Jey Tsai
*Attorney, Agent, or Firm*—Ira S. Matsil; James C. Kesterson; Richard L. Donaldson

[57] ABSTRACT

A nonvolatile memory array has two or more stacked layers of memory cells (10). The bottom layer may comprise a planar, X-cell, or buried N++ FAMOS transistor array and the top layer preferably comprises a planar transistor array. An epitaxial silicon layer (36) provides the substrate for the second layer. The stacked layer structure allows a two-fold increase in memory density without scaling the device sizes.

27 Claims, 2 Drawing Sheets

METHOD OF FORMING A NONVOLATILE STACKED MEMORY

This is a division, of application Ser. No. 07/741,978, filed Aug. 6, 1991 which is a continuation of Ser. No. 07/287,973, filed Dec. 21, 1988 now abandoned.

TECHNICAL FIELD OF THE INVENTION

This invention relates in general to integrated circuits, and particularly to a three dimensional nonvolatile memory array.

BACKGROUND OF THE INVENTION

Nonvolatile memory designs constantly strive to achieve a greater density of memory cells on a single chip. In order to increase cell density, much effort has been placed in reducing the size of the devices used to implement the memory array. Present-day designs are incorporating submicron memory cells (devices using less than one micrometer design rules) in order to achieve the higher density.

Ultimately, devices will become so small that further scaling is not possible. As the devices are scaled, other problems are encountered in metal interconnect layers and the gate oxide layers. While it is expected that devices will continue to be made smaller, the advances and chip density are not expected to be nearly as great as the density increase which has occurred over the last ten years.

Further, the state-of-the-art submicron devices suffer reliability problems. As each generation of scaled-down device emerges, it is expected that they too will suffer initial reliability problems.

Therefore, a need has arisen in the industry for a transistor structure which will increase the density of nonvolatile memory arrays using reliable design rules, presently in the range one to two micrometers.

SUMMARY OF THE INVENTION

In accordance with the present invention, a nonvolatile memory and method of forming the same is provided which substantially increases the density of the array over prior art nonvolatile memory devices.

In a first aspect of the present invention, first diffusion regions (bitlines) of a first conductivity type are disposed within a semiconductor substrate of a second conductivity type. A first array of floating gates is formed over the semiconductor substrate between the diffused regions and isolated therefrom by a dielectric layer. A first dielectric layer is formed over the array of floating gates and first control gates are formed over the dielectric layer. A second dielectric layer is formed over the control gates and is planarized to form a substantially flat surface. A semiconductor epitaxial layer is formed over the second dielectric layer and diffused regions are formed therein. A second array of floating gates are formed overlying the semiconductor epitaxial layer and isolated therefrom by a dielectric layer. A third dielectric layer is formed over the second array of floating gates and second control gates are formed over the second dielectric layer.

This aspect of the present invention provides the technical advantage that the density of memory cells on the chip may be effectively doubled, while using standard design rules to insure reliability. Further density increases can be accomplished by providing additional layers of memory cells.

In a second aspect of the present invention, first diffused regions, acting as bitlines, are disposed within a semiconductor substrate. A first array of floating gates is formed over the semiconductor substrate and isolated therefrom by an insulating layer. A first dielectric layer is formed over the first array of floating gates. The first dielectric layer is planarized and control gates are formed over the dielectric layer. A second dielectric layer is formed over the control gates and an array of floating gates is formed thereover. A semiconductor epitaxial layer is formed over the floating gates, being separated from the floating gates by a third dielectric layer.

This aspect of the present invention provides the technical advantage that one set of control gates may be used to enable devices on both the first and second layers, thereby reducing the complexity of the device.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

The preferred embodiment of the present invention is best understood by referring to FIGS. 1-2 of the drawings, like numerals being used for like and corresponding parts of the various drawings.

Figure 1A:
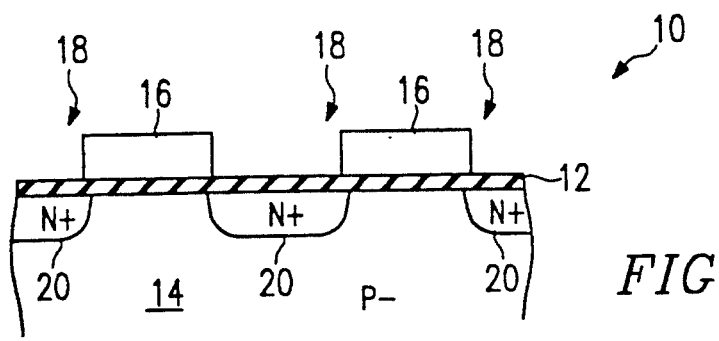
FIG. 1a illustrates a cross-sectional side view of a first embodiment of the nonvolatile memory array of the present invention after a first processing stage.

FIG. 1a illustrates a cross-sectional side view of the first embodiment of the nonvolatile memory array 10 of the present invention. A gate oxide 12 is formed on top of a semiconductor substrate 14 to a thickness of about 350 angstroms, typically by a thermal oxidation process. A polysilicon layer having a thickness of about 1500 angstroms is deposited and doped over the gate oxide 12 and is patterned and etched to form floating gates 16 in a first direction. The photoresist used to pattern the floating gates is subsequently removed. Arsenic, or another suitable dopant, is implanted through the slots 18 between the floating gates 16 to form buried N+ source and drain regions (bitlines) 20.

Figure 1B:
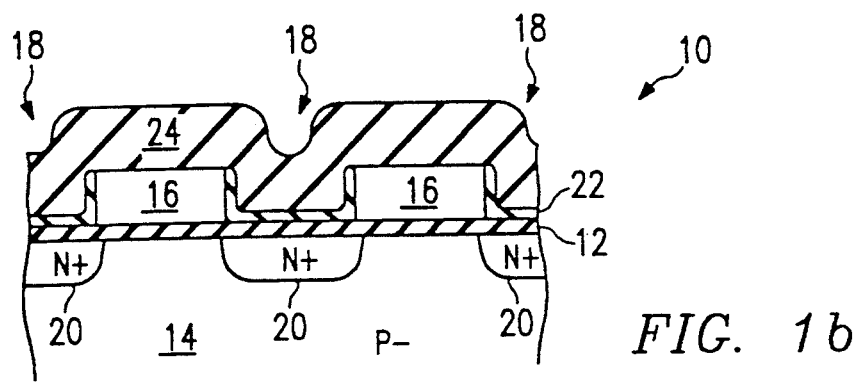
FIG. 1b illustrates a cross-sectional side view of the first embodiment of the present invention after a second processing stage.

FIG. 1b illustrates a cross-sectional side view of the first embodiment of a nonvolatile memory array after a second processing stage. A sealing oxide 22, typically a thermal oxide, is formed over the floating gates 16 and exposed portions of the gate oxide 12. A thick oxide layer 24 is deposited over the sealing oxide layer 22 such that the slots 18 are completely filled with the deposited oxide. The thick oxide layer may comprise a TEOS oxide or a DCS (dichlorisilane) + $N_2O$.

Figure 1C:
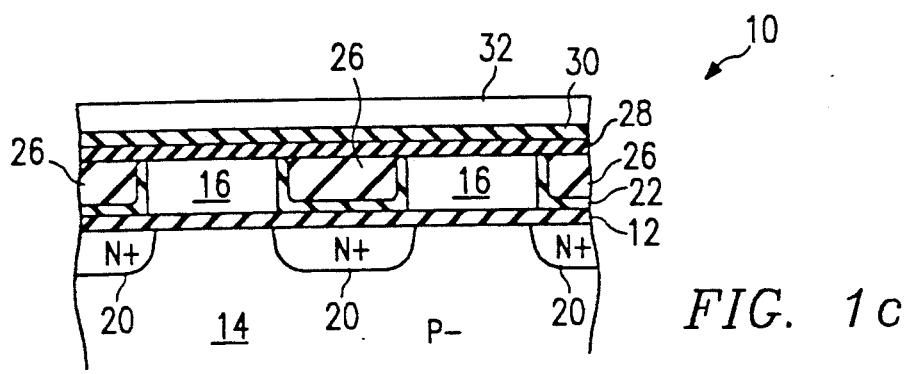
FIG. 1c illustrates a cross-sectional side view of the first embodiment of the present invention after a third processing stage.

FIG. 1c illustrates the first embodiment of the nonvolatile memory array of the present invention after a third processing stage. The thick oxide layer 24 is planarized to form isolating regions 26 between floating gates 16. The thick oxide layer 24 may be planarized using an oxide resist-etch-back (REB) process. Using this technique, a Shipley 1400-17 resist is spun-coated to 0.6 micrometers thickness over a 0.6 micrometer thick oxide layer. A fifteen minute white light exposure and a thirty minute 200° C. convection oven hard-bake may be employed to insure complete resist flow. A second photoresist pattern is formed over the periphery regions outside of the memory array. A etch having an equal selectivity to oxide and resist may be used to planarize the thick oxide layer 24. The oxide resist selectivity may be controlled by adding small amounts of $O_2$ to an etch chemistry of $CHF_3$+ $C_2F_6$+ He at 1.5 torr and 280 watts of 13.5 MHz power. The thick oxide layer 24 should be etched down to the top of the floating gates 16.

After planarizing the thick oxide layer 24, any remaining photoresist is removed and an ILO (interlevel oxide) layer 28 and an ILN (interlevel nitride) layer 30 are deposited using CVD techniques over the isolating regions 26 and exposed portions of the floating gates 16. A photoresist mask is formed over the array, and the ILN layer 30, ILO layer 28, thick oxide layer 24, and gate oxide layer 12 are stripped from the periphery (not shown).

A first set of control gates 32 associated with the floating gates 16 is formed by first depositing a layer of polysilicon having a thickness of about 3500 angstroms over the ILN layer 30. After doping the second polysilicon layer, the control gates 32 are formed using a stacked gate pattern and etch in which the pattern used to form the control gate 32 are also used to define the floating gates 16 in a second direction by etching portions of the ILN layer 30, ILO layer 28, and floating gates 16 which do not underlie the control gate 30. Portions of the sealing oxide layer 22, gate oxide layer 12 and substrate 14 not underlying either the control gate 32 or the isolating regions 26 are also etched away, forming trenches (not shown) in the substrate 14. A bitline isolation implant may be formed at the bottom of the trenches followed by formation of a sealing oxide layer 33 over the control gates 32 and the sidewalls and bottom of the trenches.

Figure 1D:
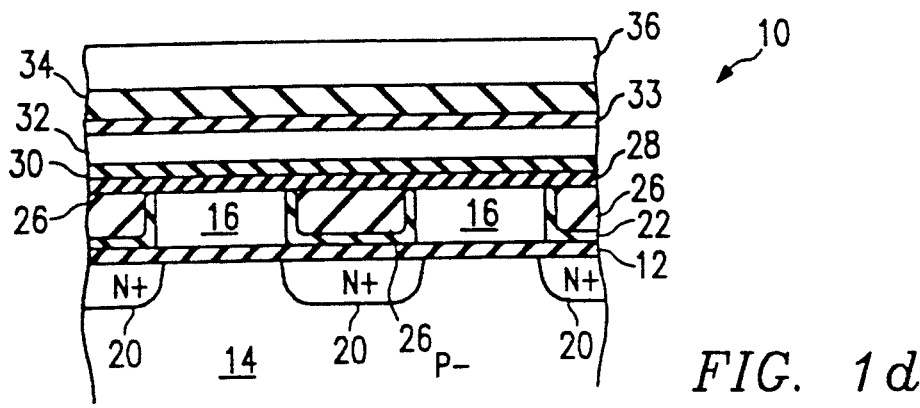
FIG. 1d illustrates a cross-sectional side view of the first embodiment of the present invention after a fourth processing stage.

FIG. 1d illustrates a cross-sectional side view of the first embodiment of the nonvolatile memory array of the present invention after a fourth processing stage A thick TEOS oxide layer 34 is formed over the topography device, filling in the trench and covering the wordlines 32. A planarizing resist is deposited over the TEOS oxide 34 and a planarizing etch is performed. Any remaining photoresist is then removed. As a result, a planar oxide layer is formed over the control gate 32.

An epitaxial silicon layer 36 is formed over the planarized TEOS oxide layer 34. The epitaxial silicon is recrystallized, preferably using a laser to reduce the heat generated to lower layers during recrystallization. Typically, the epitaxial layer ranges from five to thirteen micrometers.

Figure 1E:
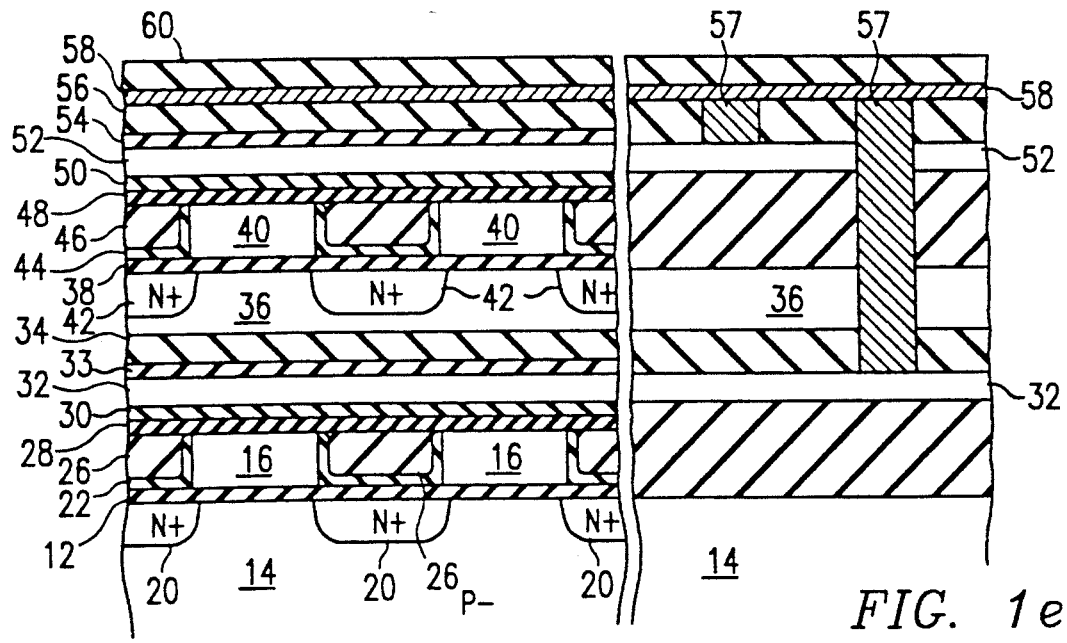
FIG. 1e illustrates a cross-sectional side view of the first embodiment of the present invention with a cut-away view of contacts made to upper and lower wordlines after a fifth processing stage.

FIG. 1e illustrates a cross-sectional side view of the first embodiment of the present invention after a fifth processing stage. After forming the epitaxial layer 36, the steps illustrated in FIGS. 1a-c are repeated to form a second layer of memory cells. A gate oxide 38 is formed over the surface of the epitaxial layer 36 and a first polysilicon layer is disposed thereover. The polysilicon layer is etched to form floating gates 40 in a first direction. Bitlines 42 are implanted and diffused into the epitaxial layer 36 and a dielectric sealing layer 44 is formed over the floating gates 40. A planar TEOS oxide layer 46 is formed between the floating gates and an ILO layer 48 and ILN layer 50 are formed over the floating gates 40 and the TEOS oxide regions 46. A second polysilicon layer is formed over the ILN layer 50 and a stack etch is performed to form control gates 52 and to etch the floating gates in a second direction. The stack etch also forms trench isolation regions in the epitaxial layer 36 between rows of floating gates.

A sealing oxide layer 54 is disposed over the control gates 52 and a thick oxide layer 56 is deposited over the topography of the structure to fill in the trenches and form a planar oxide region. The oxide layer 56 is patterned and etched to form contact holes to the wordlines 52 and 32 and the bitlines 20 and 42. A metal layer 58 is deposited over the oxide layer 56 and into the contact holes to form the contacts 57 to the wordlines 32 and 50 and bitlines 20 and 42. The metal layer 58 is patterned and etched to form interconnects. A protective oxide layer 60 is deposited over the metal layer 58 and is patterned and etched to provide test points to the metal layer 58.

While forming both top and bottom layers of memory cells using planar FAMOS transistors is preferred, it is also possible to use other combinations to form a three dimensional memory array. For example, the bottom layer could alternatively use a buried N++ FAMOS transistor structure or a X-cell FAMOS structure. However, it is desirable that the planar FAMOS transistor array be used on the top layer in order to insure the greatest reliability.

This embodiment of the present invention provides the technical advantage of a memory array whose density is effectively doubled without resorting to scaling of the devices used to form the memory array. Therefore, proven designs may be used in both the top and bottom layers of memory cells, while achieving a much greater density than would be available by merely scaling the devices.

Figure 2A:
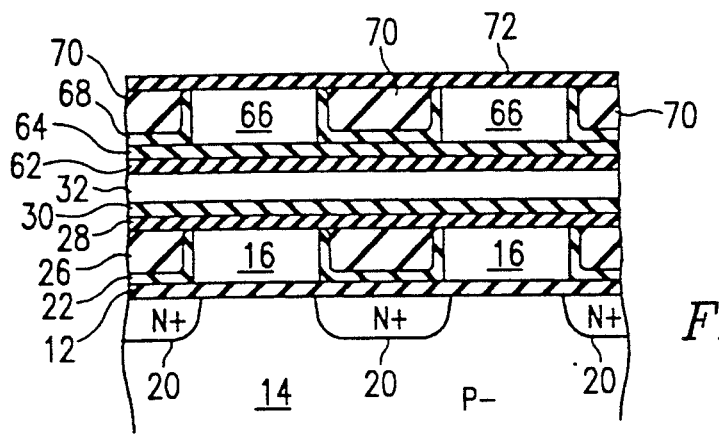
FIG. 2a illustrates a cross-sectional side view of a second embodiment of the present invention after a first processing stage.
Figure 2B:
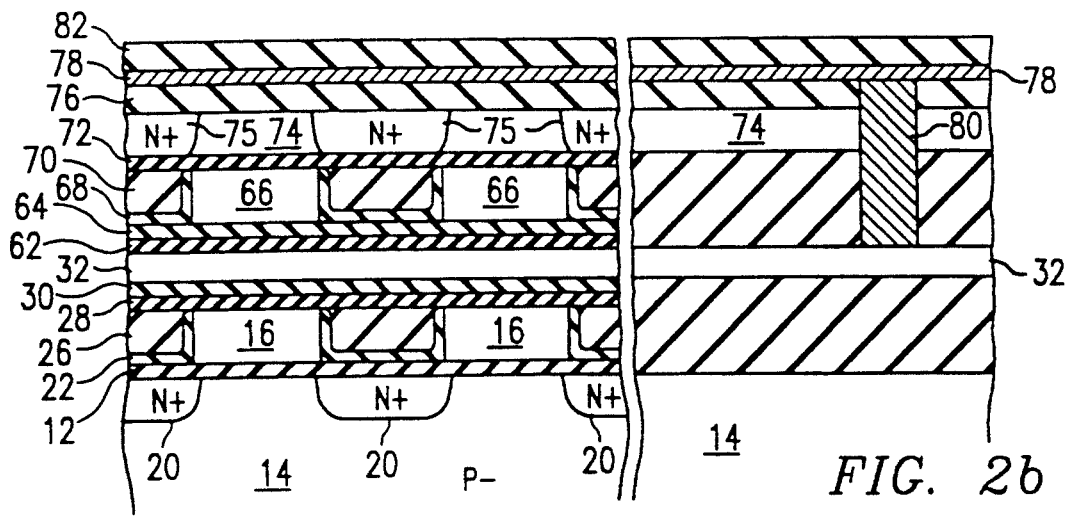
FIG. 2b illustrates a cross-sectional side view of the second embodiment of the present invention with a cut-away view of a contact made to the wordline after a second processing stage.

FIGS. 2a-b illustrate a second embodiment of the present invention using a single control gate in connection with both the top and bottom layer of memory cells FIG. 2a illustrates a cross-sectional side view of the second embodiment of the present invention after a first processing stage. The processes described in connection with FIGS. 1a-c are repeated to form the first layer of memory cells. The thick oxide layer 24 is planarized to expose the control gate 32 and a second ILO layer 62 and ILN layer 64 are formed over the wordlines 32. A third polysilicon layer is deposited over the ILN layer 64 and is patterned and etched to form floating gates 66. A sealing layer 68 is formed over the floating gates 66 and isolation regions 70 are formed between adjacent floating gates. A second gate oxide 72 is formed over the isolation regions 70 and sealing oxide layer 68, typically by deposition. An epitaxial silicon layer 74 is deposited over the gate oxide 72 and recrystallized. Bitlines 75 are formed through the epitaxial layer 74 in between columns of floating gates. Since the bitlines 75 must penetrate the epitaxial layer 74, it is desirable that it be relatively thin.

A oxide layer 76 is deposited over the epitaxial silicon layer 72 and is patterned and etched to form contact holes to the bitlines 75 and 20 and the wordlines 32. A metal layer 78 is formed over the oxide layer 76 resulting in contacts 80 formed to the diffused regions 20 and 76 (not shown) and to the wordline 32. The metal layer 78 is patterned and etched to form the interconnects and a protective oxide layer 82 is formed over the metal layer 78.

This aspect of the present invention provides the technical advantages that only one control gate is used, so only one contact to the second polysilicon layer (control gates 32) is needed.

Although the present invention has been described in detail, it should be understood that various changes, substitutions and alterations can be made herein without departing from the spirit and scope of the invention as defined by the appended claims.

What is claimed is:

1. A method of forming a nonvolatile memory array comprising the steps of:
    forming first doped regions operable as bitlines in a semiconductor substrate;
    forming first floating gates overlying said semiconductor substrate and insulated therefrom;
    forming control gates overlying said flowing gates and electrically isolated therefrom;
    forming second floating gates overlying said control gates and electronically isolated therefrom;
    forming a semiconductor layer overlying said second floating gates such that said second floating gate is electronically isolated from said semiconductor layer; and
    forming second diffused regions in said semiconductor layer.

2. The method of claim 1 and further comprising the step of forming contacts to provide an electrical connection to said first and second control gates.

3. The method of claim 1 and further comprising the step of forming trench isolation regions in said substrate and in said semiconductor layer.

4. The method of claim 1 wherein said step of forming second diffused regions comprises the step of forming second diffused regions through said semiconductor layer.

5. A nonvolatile memory formed by the process of claim 1.

6. A method of forming a non-volatile memory array comprising the steps of:
    forming a first plurality of source/drain regions in a surface of a semiconductor layer, said first source/drain regions separated by first channel regions;
    forming a first gate insulating layer over each said first channel regions;
    forming a first plurality of floating gates insulatively overlying said first channel regions, wherein two adjacent floating gates are separated by a slot;
    forming a first thick dielectric layer such that said slots are filled in;
    planarizing said first thick dielectric layer to form first isolating regions between said first floating gates and such that the top of said first floating gates are exposed;
    forming a first interlevel dielectric layer over said first floating gates;
    forming a first plurality of control gates insulatively overlying said first floating gates;
    forming a thick insulation layer over said control gates;
    forming a second semiconductor layer over said thick insulation layer;
    forming a second plurality of source/drain regions in a surface of said second semiconductor layer, said second source/drain regions separated by second channel regions;
    forming a second gate insulating layer over each said second channel regions;
    forming a second plurality of floating gates insulatively overlying said second channel regions, wherein two adjacent floating gates are separated by a slot;
    forming a second thick dielectric layer such that said slots are filled in;
    planarizing said second thick dielectric layer to form second isolating regions between said second floating gates and such that the top of said second floating gates are exposed;
    forming a second interlevel dielectric layer over said second floating gates; and
    forming a second plurality of control gates insulatively overlying said second floating gates.

7. The method of claim 6 wherein said step of forming a plurality of source/drain regions comprises the step of implanting a dopant into said semiconductor layer subsequent to forming said floating gates.

8. The method of claim 6 wherein said step of forming said thick dielectric layer comprises depositing an oxide.

9. The method of claim 8 wherein said oxide layer comprises a TEOS oxide.

10. The method of claim 6 wherein said step of planarizing said thick dielectric layer comprises the steps of forming a substantially planar resist layer over said thick dielectric layer and etching said resist layer and said dielectric layer at substantially the same rate.

11. The method of claim 10 wherein said thick dielectric layer comprises an oxide layer and wherein said rate of etching said resist and said oxide is controlled by adding $O_2$ to an etch chemistry of $CHF_3 + C_2F_6 +$ He.

12. The method of claim 6 wherein said interlevel dielectric layer comprises an interlevel oxide and an interlevel nitride.

13. The method of claim 6 wherein said step of forming a second semiconductor layer comprises the step of forming an epitaxial silicon layer.

14. The method of claim 13 and further comprising the step of recrystallizing said second semiconductor layer.

15. The method of claim 14 wherein said recrystallizing step is performed using

16. The method of claim 6 and further comprising the step of forming an additional layer of memory cells insulatively overlying said second plurality of control gates.

17. A method of forming a non-volatile memory array comprising the step of:
    forming a first plurality of source/drain regions in a surface of a semiconductor layer, said first source/drain regions separated by first channel regions;
    forming a first gate insulating layer over each said first channel regions;

forming a first plurality of floating gates insulatively overlying said first channel regions, wherein two adjacent floating gates are separated by a slot;

forming a first thick dielectric layer such that said slots are filled in;

planarizing said first thick dielectric layer to form first isolating regions between said first floating gates and such that the top of said first floating gates are exposed;

forming a first interlevel dielectric layer over said first floating gates;

forming a first plurality of control gates insulatively overlying said first floating gates;

forming a second interlevel dielectric layer over said second floating gates;

forming a second plurality of floating gates insulatively overlying said second channel regions, wherein two adjacent floating gates are separated by a slot;

forming a second thick dielectric layer such that said slots are filled in;

planarizing said second thick dielectric layer to form second isolating regions between said second floating gates and such that the top of said second floating gates are exposed;

forming a second interlevel dielectric layer over said second floating gates; and forming a second plurality of control gates insulatively layer; and forming a second plurality of source/drain regions in a surface of said second semiconductor layer, said second source/drain regions separated by second channel regions.

18. The method of claim 17 wherein said semiconductor layers comprise silicon and said floating gates and said control gates comprise doped polysilicon.

19. The method of claim 17 wherein the step of forming said floating gates comprises the step of depositing polysilicon layer having a thickness of about 1500 angstroms and patterning and etching said polysilicon layer to form floating gates.

20. The method of claim 18 wherein said step of planarizing said thick dielectric layer comprises the steps of forming a substantially planar resist layer over said thick dielectric layer and etching said resist layer and said dielectric layer at substantially the same rate.

21. The method of claim 17 and further comprising the step of forming a sealing oxide over said floating gates.

22. The method of claim 1 wherein said step of forming a semiconductor layer comprises the step of forming an epitaxial semiconductor layer.

23. The method of claim 22 and further comprising the step of recrystallizing said second semiconductor layer.

24. The method of claim 23 wherein said recrystallizing step is performed using a laser.

25. The method of claim 1 and further comprising the step of forming an additional semiconductor layer insulatively overlying said second semiconductor layer.

26. The method of claim 1 wherein said semiconductor substrate comprises a silicon substrate.

27. The method of claim 26 wherein said semiconductor layer comprises a silicon layer.

* * * * *